United States Patent [19]

Westwick

[11] Patent Number: 4,697,152
[45] Date of Patent: Sep. 29, 1987

[54] FULLY DIFFERENTIAL SWITCHED CAPACITOR AMPLIFIER HAVING AUTOZEROED COMMON-MODE FEEDBACK

[75] Inventor: Alan L. Westwick, Austin, Tex.

[73] Assignee: Motorola, Inc., Schaumburg, Ill.

[21] Appl. No.: 851,046

[22] Filed: Apr. 11, 1986

[51] Int. Cl.⁴ ............................ H03F 3/45; H03F 1/34
[52] U.S. Cl. ........................................ 330/9; 330/107; 330/253; 330/258; 330/260
[58] Field of Search .................. 330/9, 107, 109, 253, 330/258, 260, 294; 307/252, 253, 255

[56] References Cited

U.S. PATENT DOCUMENTS 4,574,250  3/1986  Senderowicz ........................ 330/258

Primary Examiner—James B. Mullins
Attorney, Agent, or Firm—John A. Fisher; Jeffrey Van Myers; Robert L. King

[57] ABSTRACT

A fully differential amplifier which is compensated for both input offset voltage error and output common-mode variation is provided. The differential amplifier provides two very accurate output reference voltages which vary in proportion to the difference between first and second input voltages. In one form, the differential amplifier functions as an integrator. A differential amplifier is provided which uses first and second input pairs of differential transistors for normal differential operation and for common-mode output voltage regulation, respectively. Both input pairs of transistors must be compensated for offset voltage associated therewith. A compensation portion external to the differential amplifier is used to compensate for an offset voltage associated with circuitry within the differential amplifier for regulating the common-mode output voltage.

6 Claims, 4 Drawing Figures

FULLY DIFFERENTIAL SWITCHED CAPACITOR AMPLIFIER HAVING AUTOZEROED COMMON-MODE FEEDBACK

TECHNICAL FIELD

This invention relates generally to amplifiers, and more particularly, to switched capacitor fully differential operational amplifiers.

BACKGROUND ART

Offset voltages are associated with every differential amplifier and are a well known source of error. Whenever a highly precise output voltage is required, circuitry for compensating offset voltage in a differential amplifier is added. One well known method for eliminating offset error associated with a differential amplifier is an "autozeroing" technique in which the offset voltage of a differential amplifier is charge shared onto a feedback capacitor during a nonvalid period of operation in a manner so that the charge cancels the offset charge during a valid period of operation. Others have used complex circuitry to compensate for offset voltage so that no periods of nonvalid circuit operation exist. However, these techniques are typically not as efficient as the described autozeroing technique. A disadvantage with fully differential amplifiers is the existence of offset error at both outputs which result from input offset error and from offset error associated with common-mode voltage control circuitry. Due to this problem, when accurate reference voltages are required, a single-ended or single output differential amplifier which is autozeroed is commonly implemented. Therefore, if two accurate reference voltages of opposite polarity are required, two distinct single-ended differential amplifiers are commonly required.

BRIEF DESCRIPTION OF THE INVENTION

Accordingly, an object of the present invention is to provide an improved fully differential switched capacitor amplifier having autozeroed common-mode feedback.

Another object of the present invention is to provide an improved fully differential operational amplifier having a common-mode output voltage which is substantially independent of offset voltage errors.

Yet another object of the present invention is to provide an improved switched capacitor integrator circuit.

A further object of the present invention is to provide a fully differential amplifier providing precise output reference voltages with respect to an analog ground voltage reference.

In carrying out the above and other objects of the present invention, there is provided, in one form, a switched capacitor fully differential amplifier circuit having a differential amplifier with first and second inputs and first and second outputs. The differential amplifier receives first and second input voltages via the first and second inputs. First and second output voltages are provided at the first and second outputs, respectively, in proportion to a differential between the first and second input voltages. The differential amplifier maintains an accurate common-mode output voltage in proportion to a common-mode feedback signal. A switched capacitor common-mode feedback portion is coupled to the differential amplifier and provides the common-mode feedback signal in proportion to the sum of the first and second output voltages. The common-mode feedback portion charge stores an error voltage associated with the common-mode output voltage during a nonvalid period of operation and cancels the error voltage during a valid period of operation to provide an accurate common-mode output voltage.

These and other objects, features and advantages will be more clearly understood from the following detailed description taken in conjunction with the accompanying drawings.

DETAILED DESCRIPTION OF THE INVENTION

Figure 1:
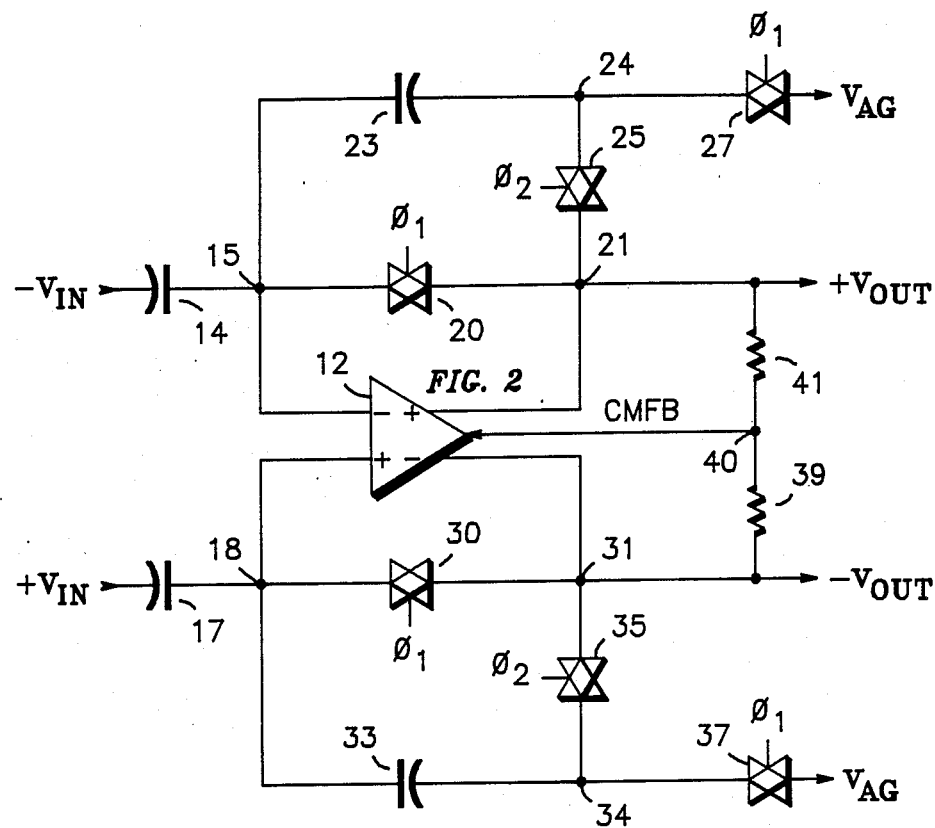
FIG. 1 illustrates in partial schematic form a fully differential switched capacitor integrator.

Shown in FIG. 1 is a fully differential switched capacitor integrator 10. A fully differential amplifier 12 has both positive and negative inputs and positive and negative outputs. A capacitor 14 has a first electrode for receiving a negative input voltage ($-V_{IN}$). A second electrode of capacitor 14 is connected to the negative input of differential amplifier 12 at a node 15. A capacitor 17 has a first electrode for receiving a positive input voltage ($+V_{IN}$). A second electrode of capacitor 17 is connected to the positive input of differential amplifier 12 at a node 18. A switch 20 has a first terminal connected to node 15 and a second terminal connected to the positive output of differential amplifier 12 at an output node 21 which provides a positive output voltage, $+V_{OUT}$. A first electrode of a capacitor 23 is connected to the negative input of differential amplifier 12 at node 15. A second electrode of capacitor 23 is connected to a node 24. First terminals of switches 25 and 27 are connected to node 24. A second terminal of switch 25 is connected to the positive output of differential amplifier 12 at node 21. A second terminal of switch 27 is connected to a reference analog ground voltage, $V_{AG}$.

A first terminal of a switch 30 is connected to the positive input of differential amplifier 12 at node 18. A second terminal of switch 30 is connected to the negative output of differential amplifier 12 at an output node 31 for providing the negative output voltage, $-V_{OUT}$. A first electrode of a capacitor 33 is connected to the positive input of differential amplifier 12 at node 18. A second electrode of capacitor 33 is connected to node 34. A first terminal of a switch 35 is connected to node 34, and a second terminal of switch 35 is connected to the negative output of differential amplifier 12 at output node 31. A first terminal of a switch 37 is connected to node 34, and a second terminal of switch 37 is connected to reference voltage terminal $V_{AG}$. A first terminal of a resistor 39 is connected to output node 31, and a second terminal of resistor 39 is connected to a feedback node 40 which is connected to a feedback terminal of differential amplifier 12. A common-mode feedback signal, labeled CMFB, is coupled to the feedback terminal of differential amplifier 12. A first terminal of a resistor 41 is connected to output node 21, and a second terminal of resistor 41 is connected to node 40. In the illustrated form, all switches have a control terminal for receiving a control signal. Two control signals labeled $\emptyset_1$ and $\emptyset_2$ which are nonoverlapping clock signals are coupled to one of the switches. In the illustrated form, control signal $\emptyset_1$ is coupled to the control terminal of switches 20, 27, 30 and 37, and control signal $\emptyset_2$ is coupled to the control terminal of switches 25 and 35. Although all switches are illustrated as being conventional MOS transistor switches which are clocked by complementary signals, other types of switches may be used.

In operation, switched capacitor integrator 10 functions to integrate negative and positive input signals with respect to an analog ground reference and provide positive and negative output voltages which are proportional to a difference between the input signals. It should be well understood that the present invention pertains to the broad field of amplifiers in which a preferred embodiment is illustrated as an integrator. The present invention may be used with other amplifier structures in addition to integrators.

In the illustrated form, when control signal $\emptyset_1$ is at a high logic level and control signal $\emptyset_2$ is at a low logic level, switches 20, 27, 30 and 37 are conductive and switches 25 and 35 are nonconductive. Therefore, operational amplifier 12 is placed into a unity gain configuration by switches 20 and 30. The input voltages are coupled to nodes 15 and 18 via input capacitors 14 and 17, respectively. It should be readily understood that any type of input structure may be utilized in place of capacitors 14 and 17. In the illustrated form, capacitors 14 and 17 function to differentiate the input voltages. Therefore, the actual integration function is performed by the illustrated circuitry exclusive of input capacitors 14 and 17. When the function of capacitors 14 and 17 is considered, an actual voltage amplification is realized at the dual outputs rather than a voltage integration. Capacitors 23 and 33 provide a dual function in which each capacitor integrates a respective input voltage and each capacitor also cancels or autozeros the offset voltage of differential amplifier 12. The second electrodes of both capacitors 23 and 33 are connected to the ground reference by switches 27 and 37, respectively. The first electrodes of capacitors 23 and 33 are connected to the input nodes 15 and 18, respectively. Therefore, an offset voltage associated with differential amplifier 12 is charged onto each of capacitors 23 and 33. When control signals $\emptyset_1$ and $\emptyset_2$ change logic levels, switches 20, 27, 30 and 37 become nonconductive and switches 25 and 35 become conductive. In this switched configuration, feedback capacitors 23 and 33 are connected across respective input and output terminals of differential amplifier 12. The offset voltage at each differential input of differential amplifier 12 is summed with the previously stored offset voltage on the respective feedback capacitor in an opposite polarity so that there is no effective output voltage error added into either output of differential amplifier 12. The output voltages at nodes 21 and 31 are divided by feedback resistors 41 and 39 which function as linear devices to insure that a predetermined common-mode output voltage is maintained at node 40. To attain maximum dynamic range, resistors 39 and 41 have equal values. Whenever equal input voltages are applied to the inputs of differential amplifier 12, the output voltages should be at exactly the predetermined common-mode output voltage. To further understand the operation of integrator 10, a detailed discussion of differential amplifier 12 will now be provided.

Figure 2:
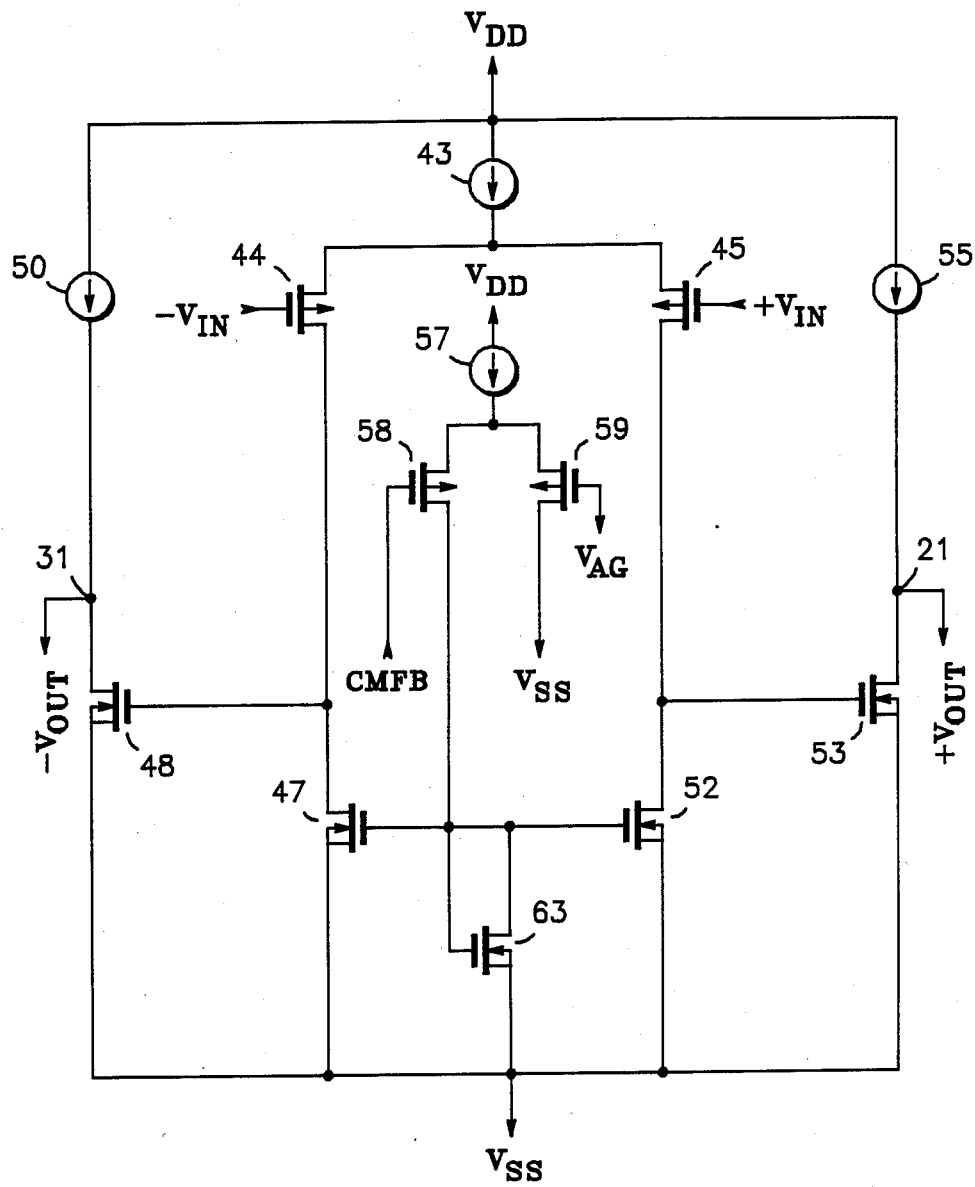
FIG. 2 illustrates in schematic form a fully differential amplifier for use in the integrator of FIG. 1.

Shown in FIG. 2 is a schematic of one of several possible implementations of differential amplifier 12 of FIG. 1. Differential amplifier 12 provides a positive output voltage, $+V_{OUT}$, at node 21 which is correlated to FIG. 1 and a negative output voltage, $-V_{OUT}$, at node 31 which is also correlated to FIG. 1. A current source 43 has a first terminal connected to a power supply voltage $V_{DD}$. A second terminal of current source 43 is connected to sources of a differential input pair of P-channel transistors 44 and 45. A gate of transistor 44 is coupled to a negative input voltage, $-V_{IN}$, and a gate of transistor 45 is coupled to a positive input voltage, $+V_{IN}$. A source of transistor 44 is connected to both a drain of an N-channel transistor 47 and a gate of an N-channel transistor 48. A source of transistor 47 is connected to a power supply voltage $V_{SS}$. In the illustrated form, power supply voltage $V_{DD}$ is more positive than power supply voltage $V_{SS}$. Further, to obtain maximum dynamic output voltage range, $V_{AG}$ is preferably the average of the sum of supply voltages $V_{DD}$ and $V_{SS}$. A first terminal of a current source 50 is connected to power supply voltage $V_{DD}$, and a second terminal of current source 50 is connected to a drain of transistor 48 at output node 31. A source of transistor 48 is connected to power supply voltage $V_{SS}$. A drain of transistor 45 is connected to both a drain of an N-channel transistor 52 and a gate of a N-channel transistor 53. A gate of transistor 52 is connected to a gate of transistor 47, and a source of transistor 52 is connected to power supply voltage $V_{SS}$. A current source 55 has a first terminal connected to power supply voltage $V_{DD}$ and a second terminal connected to a drain of transistor 53 at output node 21. A source of transistor 53 is connected to power supply voltage $V_{SS}$. A current source 57 has a first terminal connected to power supply voltage $V_{DD}$ and a second terminal connected to a source of P-channel transistors 58 and 59. A drain of transistor 59 is connected to power supply voltage $V_{SS}$, and a gate of transistor 59 is connected to the analog ground reference voltage $V_{AG}$. A gate of transistor 58 receives the common-mode feedback voltage, CMFB, from node 40 of integrator 10 of FIG. 1, and a drain of transistor 58 is connected to the gates of transistors 47 and 52 and to both a gate and a drain of an N-channel transistor 63. A source of transistor 63 is connected to power supply voltage $V_{SS}$.

In operation, differential amplifier 10 functions in a manner similar to my U.S. patent application Ser. No. 06/829,879 entitled "A Fully Differential Operational Amplifier Which Minimizes Output D.C. Common-Mode Voltage Variation", now abandoned. Positive and negative input voltages are coupled to the gates of transistors 45 and 44, respectively, and positive and negative output voltages are provided at nodes 21 and 31, respectively, in proportion to the difference between the input voltages. In a balanced operation when both input voltages are equal, an equal amount of current is conducted by transistors 44 and 45. Therefore, transistors 48 and 53 are equally biased and can conduct an equal amount of current which results in the output voltages at nodes 21 and 31 being equal. When one input voltage differs from the other, unequal currents are caused to be conducted by transistors 44 and 45 which affects the biasing of transistors 48 and 53 since transistors 47 and 52 are biased to conduct equal amounts of current. Therefore, one output voltage increases by an amount above the common-mode output voltage which is equal to the amount the other output voltage decreases below the common-mode output voltage. The output common-mode voltage is set and maintained by the operation of transistors 58, 59 and 63. In particular, the common-mode output voltage is set by the bias voltage for transistor 59 to be equal to $V_{AG}$. If the common-mode feedback voltage, CMFB, is equal to $V_{AG}$, transistors 58 and 59 conduct equal currents. The current conducted by transistor 63 establishes a bias voltage for transistors 47 and 52 which affect the bias to transistors 48 and 53, respectively. Should the CMFB voltage increase above $V_{AG}$, transistor 58 conducts less current which reduces the bias to transistors 47 and 52. Accordingly, the bias voltage to transistors 48 and 53 is increased which lowers the output common-mode voltage until transistors 58 and 59 again conduct equal amounts of current. Similarly, should the CMFB voltage decrease below $V_{AG}$, transistor 58 conducts more current which increases the bias to transistors 47 and 52. Accordingly, the voltage bias to transistors 48 and 53 is decreased which increases the output common-mode voltage until transistors 58 and 59 again conduct equal amounts of current. However, due to error voltages resulting from transistor offset and matching errors of transistors 58 and 59 which comprise the common-mode output voltage circuitry, the common-mode output voltage may not always be at exactly the predetermined value. Generally, a variation of the output common-mode voltage is not critical because the output voltages are coupled to a successive differential input stage which will reject the common-mode voltage variation. However, if a successive stage is not a differential input structure, the common-mode voltage error is not corrected and may be a severe problem.

Figure 3:
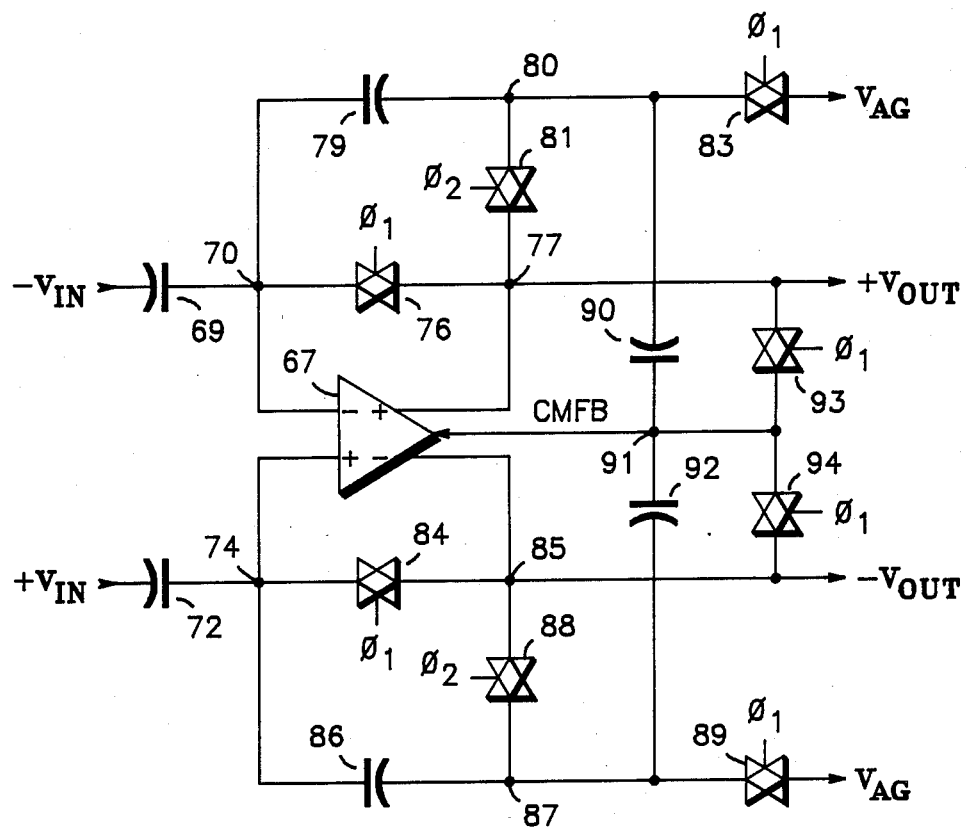
FIG. 3 illustrates in partial schematic form a fully differential switched capacitor integrator in accordance with the present invention.

Shown in FIG. 3 is a switched capacitor fully differential integrator 65 which provides differential output voltages which have substantially no error and an accurate common-mode output voltage. In particular, a fully differential amplifier 67 has positive and negative inputs and outputs. Differential amplifier 67 may be implemented as differential amplifier 12 of FIG. 2 or by other differential amplifiers. A capacitor 69 has a first electrode for receiving a negative input voltage, $-V_{IN}$, and a second electrode connected to the negative input of differential amplifier 67 at a node 70. A capacitor 72 has a first electrode for receiving a positive input voltage, $+V_{IN}$, and a second electrode connected to the positive input of differential amplifier 67 at a node 74. A first terminal of a switch 76 is connected to node 70, and a second terminal of switch 76 is connected to the positive output of differential amplifier 67 at an output node 77 for providing a positive output voltage, $+V_{OUT}$. A first electrode of a capacitor 79 is connected to node 70 and has a second electrode connected to a node 80. A switch 81 has a first terminal connected to node 80 and a second terminal connected to node 77. A switch 83 has a first terminal connected to node 80 and a second terminal connected to an analog ground reference voltage, $V_{AG}$. A switch 84 has a first terminal connected to node 74, and a second terminal connected to the negative output of differential amplifier 67 at an output node 85 for providing a negative output voltage, $-V_{OUT}$. A capacitor 86 has a first electrode connected to node 74 and a second electrode connected to a node 87. A switch 88 has a first terminal connected to node 87 and a second terminal connected to node 85. A switch 89 has a first terminal connected to node 87 and a second terminal connected to reference voltage analog ground, $V_{AG}$. A capacitor 90 has a first electrode connected to node 80 and a second electrode connected to node 91 which functions as a feedback input of differential amplifier 67 for providing a common-mode feedback signal, CMFB. A first electrode of a capacitor 92 is connected to node 87, and a second electrode of capacitor 92 is connected to node 91. A switch 93 has a first terminal connected to node 77 and a second terminal connected to node 91. A switch 94 has a first terminal connected to node 91 and a second terminal connected to output node 85. In the illustrated form, all switches are MOS transmission gates which are clocked by complementary control signals. Clock signals $\phi_1$ and $\phi_2$ are nonoverlapping clock signals as previously described in connection with FIG. 1. It should again be noted that other types of input structures besides capacitors 69 and 72 may be utilized and that the integration function of integrator 65 does not actually include the use of capacitors 69 and 72.

In operation, when control signal $\phi_1$ is at a logic high level and control signal $\phi_2$ is at a logic low level, integrator 65 is in an "autozero" mode of operation in which the offset voltage of differential amplifier 67 is being automatically zeroed out. Switches 76, 83, 84, 89, 93 and 94 are conductive and switches 81 and 88 are nonconductive. Assuming that differential amplifier 12 of FIG. 2 is used as differential amplifier 67 of FIG. 3, the positive and negative outputs of differential amplifier 67 will be substantially equal to the predetermined common-mode output voltage $V_{AG}$. However, an offset voltage associated with differential transistors 58 and 59 will create an error in the output common-mode voltage so that neither output voltage is at exactly $V_{AG}$. Switches 93 and 94 have some finite amount of impedance and appear as resistors between node 91 and the differential outputs of differential amplifier 67. Therefore, the resistance of switches 93 and 94 sets the common-mode output voltage during the autozero mode. Since the voltage across switches 93 and 94 is very small, the resistance of switches 93 and 94 appears to be substantially linear. Therefore, the common-mode feedback signal CMFB is established thru switches 93 and 94. During the autozero period, the offset voltage of differential amplifier 67 associated with the differential input pair of transistors is charged onto each of feedback capacitors 79 and 86 in the same manner as performed in integrator 10 of FIG. 1. Each of capacitors 90 and 92 is charged to the offset voltage of the common-mode feedback circuit since the first electrodes of capacitors 90 and 92 are connected to $V_{AG}$.

During a valid output mode, control signal $\phi_2$ is at a logic high level and control signal $\phi_1$ is at a logic low level. Therefore, switches 81 and 88 are conductive and switches 76, 83, 84, 89, 93 and 94 are nonconductive. Capacitors 90 and 92 are now configured to form a capacitive voltage division. Capacitors 90 and 92 function as two impedances with respect to the common-mode feedback in the same way as switches 93 and 94 do during the autozero mode. In most MOS processes, capacitors can be fabricated as linear and accurate valued devices. The offset voltage associated with the common-mode feedback circuit is added with the previously stored offset voltage and is totally compensated. In particular, the voltage initially stored on capacitor 90 is slightly offset at the first electrode with respect to the second electrode. When in the valid operation mode, the first electrodes of capacitors 90 and 92 are connected to output nodes 77 and 85, respectively. Because a stored offset voltage initially existed on capacitors 90 and 92, the output common-mode voltage will not be at exactly $+(V_{OUT}/2)$. Therefore, node 91 will be held at a voltage which is shifted by an offset, $V_{offset}$, from the exact middle point of the two output voltages. However, the offset voltage of the common-mode feedback differential input transistors 58 and 59 is coupled to each of capacitors 90 and 92 in a polarity exactly opposite to the polarity of offset voltage stored by capacitors 90 and 92. Therefore, the common-mode output voltage error is corrected and a precise output voltage is provided in differential form.

When the control signals change logic levels again and integrator 65 returns to an autozero mode, switches 83 and 89 discharge output capacitors 90 and 92 by coupling the first electrodes of capacitors 90 and 92 to analog ground. Capacitors 90 and 92 then charge back to the common-mode circuitry offset voltage coupled to node 91. It should be apparent that the present invention is not restricted to using a single type of feedback network in conjunction with differential amplifier 67. Therefore, the present invention is independent of the transfer function of differential amplifier 67.

It should be noted that the operation of the circuit loops comprising feedback capacitors 79 and 86 are entirely independent loops from the loops involving the common-mode output capacitors 90 and 92. However, it should be noted that switches 88 and 89 serve a dual purpose in that these switches make the necessary switching for both the second electrode of capacitor 86 and the first electrode of capacitor 92. Similarly, switches 81 and 83 serve a dual purpose to switch both capacitor 79 and capacitor 90 in an analogous manner. Therefore, the only additional circuitry required to eliminate the output common-mode offset error includes capacitors 90 and 92 and switches 93 and 94.

Figure 4:
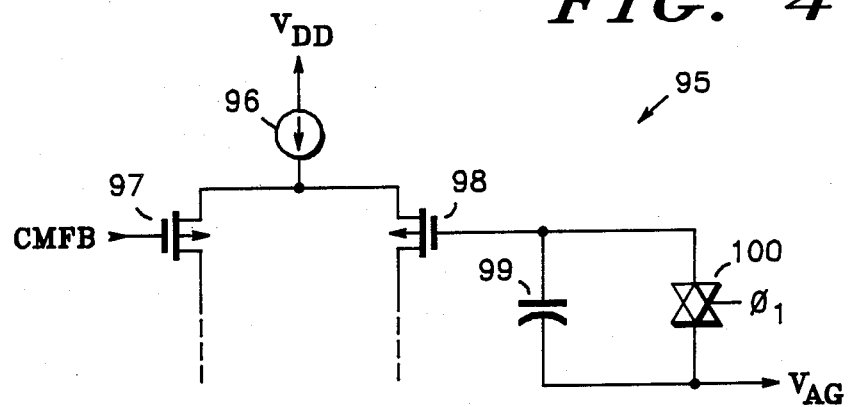
FIG. 4 illustrates in schematic form a compensation circuit for use with the fully differential amplifier of FIG. 2.

Shown in FIG. 4 is a compensating network 95 which may be used in lieu of current source 57 and transistors 58 and 59 of FIG. 2. In particular, current source 96 has a first terminal connected to supply voltage $V_{DD}$ and a second terminal connected to sources of P-channel transistors 97 and 98. A gate of transistor 97 is connected to the common-mode feedback signal, CMFB. The gate of transistor 98 is connected to both a first electrode of a capacitor 99 and a first terminal of a switch 100. A second terminal of switch 100 and a second electrode of capacitor 99 are connected together and to the analog ground reference voltage, $V_{AG}$. A control terminal of switch 100 is coupled to clock signal $\emptyset_1$.

In operation, compensating network 90 may be used to avoid charging a small error charge onto capacitors 90 and 92 as a result of conventional clock feedthrough error when turning switches 93 and 94 on and off. Capacitors 90 and 92 may be fabricated as large capacitors and switches 93 and 94 may be fabricated as small devices which significantly minimizes clock feedthru error. However, in those applications where no error may be tolerated, the compensating network substantially eliminates all output switch noise error. Instead of connecting the gate of differential input transistor 98 to the predetermined common-mode output voltage, $V_{AG}$, the gate of transistor 98 is connected to an additional capacitor 99 coupled in parallel with a switch 100. Capacitor 99 is fabricated to be the same size as capacitors 90 and 92, and switch 100 is fabricated to be the same size as switches 93 and 94. Switch 100 is controlled by the same control signal as switches 93 and 94 so that all three switches are conductive at the same time. When clock signal $\emptyset_1$ makes switch 100 conductive, the gate of transistor 98 is connected to analog ground and is conductive. When clock signal $\emptyset_1$ makes switch 100 nonconductive, an error charge equal to the error charge coupled to each of capacitors 90 and 92 is coupled to capacitor 99 and stored thereon. As a result, the bias voltage of transistor 98 is shifted by an amount substantially equal to the clock feedthru error voltage introduced onto transistor 97. Therefore, an equal clock feedthru error voltage is coupled to both transistors 97 and 98 in a manner to effectively reject the clock feedthru error voltage. It should be apparent that the present invention may be practised without utilizing compensating network 95.

By now it should be apparent that an autozeroed common-mode feedback circuit and method has been provided for use with a fully differential switched capacitor amplifier. Offset voltage errors associated with the common-mode feedback circuitry inside a fully differential operational amplifier have been substantially eliminated. As a result, accurate differential reference voltages may be provided with a minimum of circuitry. The present invention is also advantageous over previous circuits for applications when only one of the two output voltages needs to be precise but a double-ended output is also required.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A switched capacitor fully differential amplifier circuit, comprising:
   differential amplifier means having first and second inputs and first and second outputs, the differential amplifier receiving first and second input voltages via the first and second inputs and providing first and second output voltages via said first and second outputs in proportion to a differential between the first and second input voltages, said differential amplifier maintaining an accurate common-mode output voltage in proportion to a common-mode feedback signal; and
   switched capacitor common-mode feedback means coupled to the differential amplifier means for providing said common-mode feedback signal in proportion to a sum of the first and second output voltages, said common-mode feedback means charge storing an error voltage associated with the common-mode output voltage during a nonvalid period of operation and cancelling the error voltage during a valid period of operation following the nonvalid period to provide an accurate common-mode output voltage.

2. The switched capacitance fully differential amplifier of claim 1 further comprising:
   first feedback means coupled between the first input and first output of the differential amplifier means, for storing a second error voltage associated with an input offset voltage of the differential amplifier means during the nonvalid period and cancelling the second error voltage during the valid period of operation to provide an accurate first output voltage; and second feedback means coupled between the second input and second output of the differential amplifier means, for storing a third error voltage associated with the input offset voltage of the differential amplifier means during the nonvalid period and cancelling the third error voltage during the valid period of operation to provide an accurate second output voltage.

3. The switched capacitor fully differential amplifier circuit of claim 1 wherein the switched capacitor common-mode feedback means further comprise:

a first capacitor having first and second electrodes;

first switching means coupled to the first electrode of the first capacitor, for alternately coupling the first electrode thereof to a reference voltage terminal and to the first output of the differential amplifier means during the nonvalid and valid periods, respectively;

a second capacitor having first and second electrodes;

second switching means coupled to the first electrode of the second capacitor, for alternately coupling the first electrode thereof to a reference voltage terminal and to the second output of the differential amplifier means during the nonvalid and valid periods, respectively; and third switching means coupled to the second electrodes of the first and second capacitors, for coupling the second electrodes to both the first and second outputs of the differential amplifier means during the nonvalid period.

4. The switched capacitor fully differential amplifier of claim 1 further comprising:

first input capacitance means having a first electrode for receiving the first input voltage, and a second electrode coupled to the first input of the differential amplifier means; and second input capacitance means having a first electrode for receiving the second input voltage, and a second electrode coupled to the second input of the differential amplifier means.

5. A fully differential amplifier circuit having an accurate common-mode output voltage, comprising:

differential amplifier means comprising:

a first differential pair of transistors for receiving first and second input voltages and having a first offset voltage associated therewith, thereby creating first and second error voltages at both a first and a second output, respectively, with respect to a reference voltage; and a second differential pair of transistors for receiving both a predetermined common-mode output reference voltage and the common-mode output voltage and maintaining the common-mode output voltage at the reference voltage, said second differential pair of transistors having a second offset voltage associated therewith, thereby creating a common-mode error voltage at both the first and second outputs;

first feedback means coupled between a first transistor of the first differential pair and the first output, for correcting the first error voltage at the first output resulting from the first offset voltage;

second feedback means coupled between a second transistor of the first differential pair and the second output, for correcting the second error voltage at the second output resulting from the first offset voltage; and common-mode feedback means coupled to the differential amplifier means and the first and second feedback means, said common-mode feedback means cancelling the common-mode error voltage at the first and second outputs by selectively storing an equal but opposite value of error voltage to cancel the common-mode error voltage.

6. A switched capacitor fully differential amplifier having a precise common-mode output voltage, comprising:

a differential amplifier having first and second inputs, first and second outputs, and a control input for controlling the common-mode output voltage;

a first switch having a first terminal coupled to the first input of the differential amplifier, a second terminal coupled to the first output of the differential amplifier, and a control input for receiving a first control signal;

a first capacitor having a first electrode coupled to the first input of the differential amplifier, and a second electrode;

a second switch having a first terminal coupled to the second electrode of the first capacitor, a second terminal coupled to the first output of the differential amplifier, and a control input coupled to a second control signal;

a third switch having a first terminal coupled to the second electrode of the first capacitor, a second terminal coupled to a reference voltage terminal, and a control input coupled to the first control signal;

a fourth switch having a first terminal coupled to the second input of the differential amplifier, a second terminal coupled to the second output of the differential amplifier, and a control input coupled to the first control signal;

a second capacitor having a first electrode coupled to the second input of the differential amplifier, and a second electrode;

a fifth switch having a first terminal coupled to the second electrode of the second capacitor, a second terminal coupled to the second output of the differential amplifier, and a control input for receiving the second control signal;

a sixth switch having a first terminal coupled to the second electrode of the second capacitor, a second terminal coupled to the reference voltage terminal, and a control input coupled to the first control signal;

a third capacitor having a first electrode coupled to the first terminal of the sixth switch, and a second electrode coupled to the control input of the differential amplifier;

a fourth capacitor having a first electrode coupled to the first terminal of the third switch, and a second electrode coupled to the control input of the differential amplifier;

a seventh switch having a first terminal coupled to the first output of the differential amplifier, a second terminal coupled to the control input of the differential amplifier, and a control input for receiving the first control signal; and an eighth switch having a first terminal coupled to the second output of the differential amplifier, a second terminal coupled to the control input of the differential amplifier, and a control input for receiving the first control signal.

* * * * *